US010096651B2

United States Patent
Yang et al.

(10) Patent No.: US 10,096,651 B2
(45) Date of Patent: Oct. 9, 2018

(54) RESISTIVE MEMORY DEVICES AND ARRAYS

(71) Applicant: Hewlett Packard Enterprise Development LP, Houston, TX (US)

(72) Inventors: Jianhua Yang, Palo Alto, CA (US); Ning Ge, Palo Alto, CA (US); Katy Samuels, Palo Alto, CA (US); Minxian Max Zhang, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/329,913

(22) PCT Filed: Jan. 29, 2015

(86) PCT No.: PCT/US2015/013494
§ 371 (c)(1),
(2) Date: Jan. 27, 2017

(87) PCT Pub. No.: WO2016/122523
PCT Pub. Date: Aug. 4, 2016

(65) Prior Publication Data
US 2017/0271409 A1    Sep. 21, 2017

(51) Int. Cl.
*H01L 27/24* (2006.01)
*G11C 13/00* (2006.01)
(Continued)

(52) U.S. Cl.
CPC ...... *H01L 27/2418* (2013.01); *G11C 11/1659* (2013.01); *G11C 13/004* (2013.01);
(Continued)

(58) Field of Classification Search
CPC ............. H01L 27/2418; H01L 27/2409; G11C 11/1659; G11G 13/004; G11G 13/0069
See application file for complete search history.

(56) References Cited

U.S. PATENT DOCUMENTS 7,880,692 B2    2/2011   Wang
8,546,785 B2 *  10/2013  Yang .................. H01L 27/2463
                                                257/2
(Continued)

OTHER PUBLICATIONS

Burr, G.W., et al., Access Devices for 3D Crosspoint Memory, Jul. 24, 2014, American Vacuum Society, J. Vac. Sci. Technology B 32(4), pp. 040802-1-040802-23.
(Continued)

*Primary Examiner* — Tran Tran
*Assistant Examiner* — Trang Tran
(74) *Attorney, Agent, or Firm* — Dierker & Associates, P.C.

(57) ABSTRACT

A resistive memory device includes a first electrode, a memristor coupled in electrical series with the first electrode, a second electrode coupled in electrical series with the memristor, a selector coupled in electrical series with the second electrode, and a third electrode coupled in electrical series with the selector. The memristor includes oxygen or nitrogen elements. The selector includes a composite dielectric material of a first dielectric material, a second dielectric material that is different from the first dielectric material, and a dopant material including a cation having a migration rate faster than the oxygen or the nitrogen elements of the memristor. The first dielectric material and the second dielectric material are present in a ratio ranging from 1:9 to 9:1, and a concentration of the dopant material in the composite dielectric material ranges from about 1% up to 50%.

12 Claims, 3 Drawing Sheets

(51) Int. Cl.
    *H01L 45/00*     (2006.01)
    *G11C 11/16*     (2006.01)

(52) U.S. Cl.
    CPC ...... *G11C 13/0007* (2013.01); *G11C 13/0069* (2013.01); *H01L 27/2409* (2013.01); *H01L 27/2463* (2013.01); *H01L 45/08* (2013.01); *H01L 45/085* (2013.01); *H01L 45/1233* (2013.01); *H01L 45/1253* (2013.01); *H01L 45/145* (2013.01); *H01L 45/146* (2013.01); *H01L 45/16* (2013.01); *H01L 45/1625* (2013.01); *G11C 2213/32* (2013.01); *G11C 2213/34* (2013.01); *G11C 2213/76* (2013.01)

(56) References Cited

U.S. PATENT DOCUMENTS

| | | |
|---|---|---|
| 2007/0215977 A1 | 9/2007 | Lee et al. |
| 2009/0231910 A1 | 9/2009 | Liu et al. |
| 2012/0250395 A1 | 10/2012 | Nodin |
| 2013/0234091 A1 | 9/2013 | Greeley et al. |
| 2013/0322158 A1 | 12/2013 | Mouli |
| 2014/0151626 A1 | 6/2014 | Phatak |
| 2014/0268989 A1 | 9/2014 | Hong et al. |
| 2014/0353568 A1 | 12/2014 | Boniardi et al. |

OTHER PUBLICATIONS

International Searching Authority, The International Search Report and the Written Opinion, dated Sep. 30, 2015, 11 Pages.

\* cited by examiner

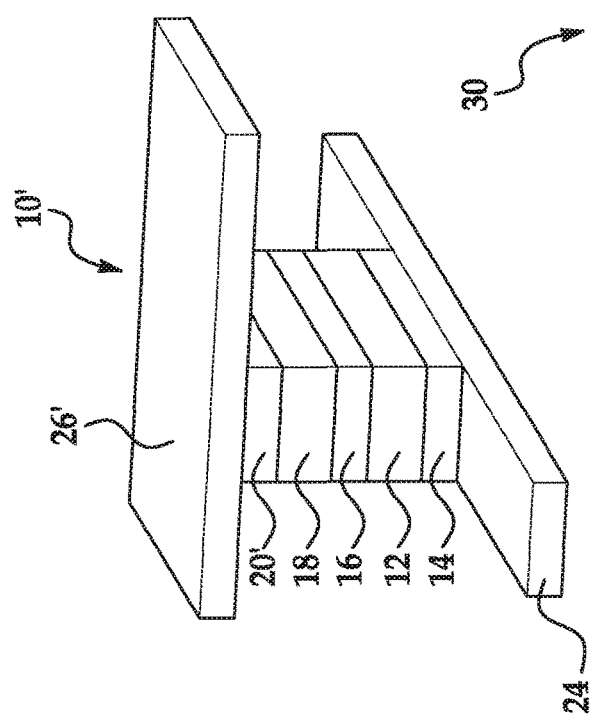
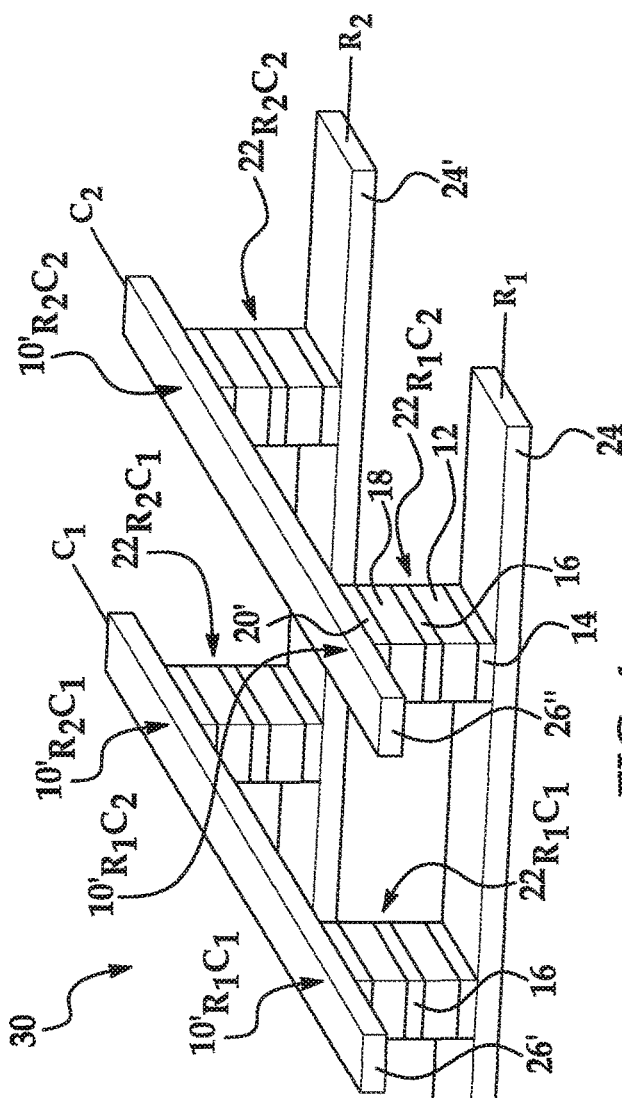

RESISTIVE MEMORY DEVICES AND ARRAYS

BACKGROUND

An electronic device may incorporate a selector in order to aid in controlling the electrical properties of the device. In an example device, a selector may be combined with a memristor to form a resistive memory device at each crosspoint in a crossbar array of resistive memory devices. Memristors are devices that can be programmed to different resistive states by applying a programming energy, such as a voltage. Large crossbar arrays of memory devices can be used in a variety of applications, including random access memory, non-volatile solid state memory, programmable logic, signal processing control systems, pattern recognition, and other applications.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 3 is a semi-schematic, perspective view of another example of a resistive memory device disclosed herein;

FIG. 4 is a semi-schematic, perspective view of an example of a resistive memory array disclosed herein;

DETAILED DESCRIPTION

Figure 1:
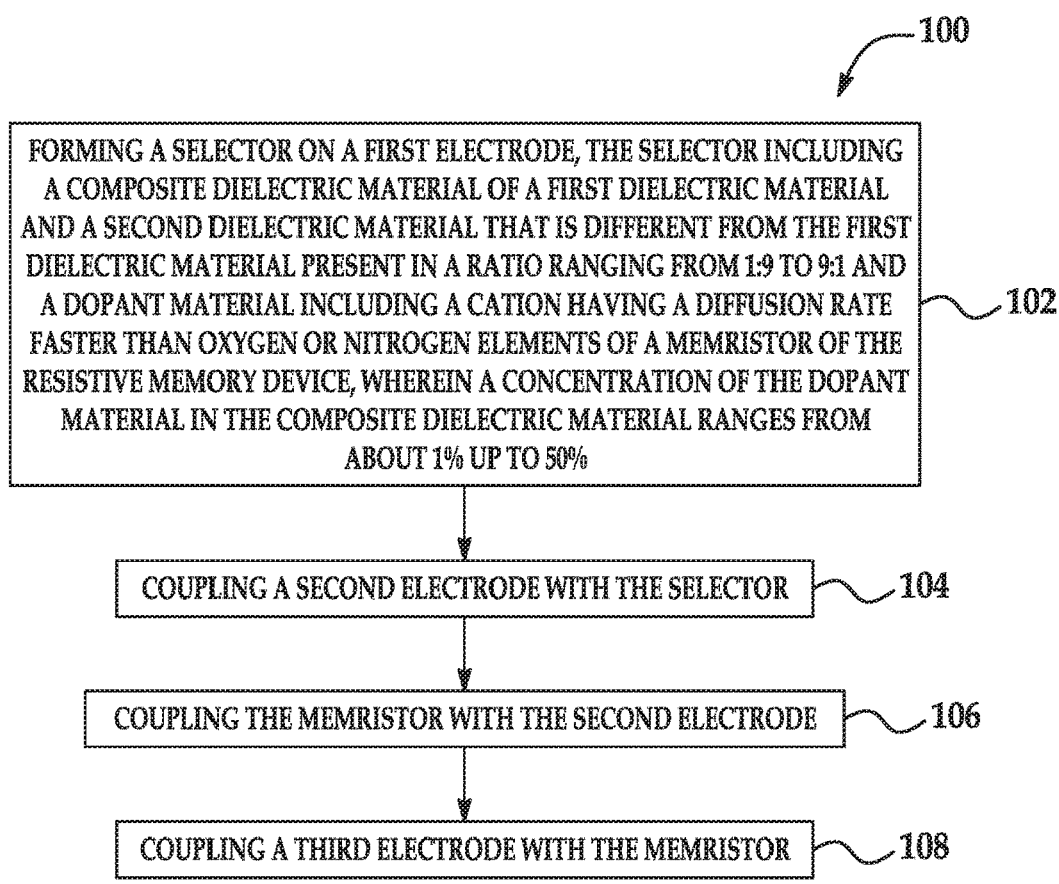
FIG. 1 is a flow diagram illustrating an example method for manufacturing an example of a resistive memory device.

Memristors are devices that may be used as components in a wide range of electronic circuits, such as memory devices, switches, radio frequency circuits, and logic circuits and systems. When used as a basis for a memory device, the memristor may be used to store bits of information, e.g., 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). Several memory devices may be incorporated together into a crossbar array of memory devices.

In the examples disclosed herein, a selector is coupled in series with the memristor to form a working integrated cell/device. The selector is formed of a cation doped composite dielectric material. The composition of the cation doped composite dielectric material contains a certain ratio of two different dielectric materials as well as a certain concentration of the cation dopant. The composition of the cation doped composite dielectric material may be altered in order to tune a threshold/switching voltage of the selector to correspond with a threshold/switching voltage of the memristor. By "correspond with," it is meant that the threshold/switching voltage of the selector is higher than the memristor's read voltage and lower than the memristor's write voltage, and thus is optimized to work well with the threshold/switching voltage of the memristor. As such, when the memristor is being read, the selector has a high resistance, and when the memristor is being written to, the selector has a low resistance. In an example, the threshold/switching voltage of the selector corresponds with the threshold/switching voltage of the memristor when the threshold/switching voltage of the selector is at least 0.1V higher than the memristor's read voltage and at least 0.1V lower than the memristor's write voltage. Together the selector disclosed herein and the memristor increase the current-voltage non-linearity of the cell/device.

In addition, the selector is volatile while the memristor is non-volatile. As such, the memristor can be switched to a particular state (for example, the ON state), upon application of a voltage at or above the threshold voltage, and then remains in that state until the application of the opposite voltage. In contrast, the selector switches between the ON and OFF states, respectively, upon application of a voltage at or above the threshold voltage and removal of the threshold voltage. The volatility of the selector and its ability to readily move into the OFF or ground state when the voltage is reduced or removed allows for electrical isolation of the memristor from its neighbors in a crossbar array. The behavior of the selector is due, in part, to the cation dopant that is present. The cation dopant is selected so that it has a faster migration rate than the oxygen or nitrogen elements (e.g., ions, vacancies, etc.) present in the memristor. The quick diffusing cation dopants of the selector enable conducting channels to readily form within the selector upon exposure to the threshold voltage (switching to the ON state) and to readily dissolve/dissipate when the voltage is removed (switching to the OFF state).

A method for manufacturing an example of the resistive memory device is disclosed herein. An example of this method 100 is shown in FIG. 1. The method involves coupling components together. In the examples disclosed herein, coupling may mean forming an electrically-conducting connection between the components. For example, coupling in step 204 of the method 100 may include electrically connecting the second electrode with the selector. In the examples disclosed herein, the electrical connections are in series, and as such, the components are electrically connected along a single path so that the same current flows through all of the components. While the components may be in series, they may or may not be in direct contact with one another and the order of the components may vary. For example, the memristor may be formed adjacent to the top conductor while the selector is formed adjacent to the bottom conductor of the device. In this example, the memristor and the bottom conductor are in series, but are not in direct contact with one another.

Figure 2:
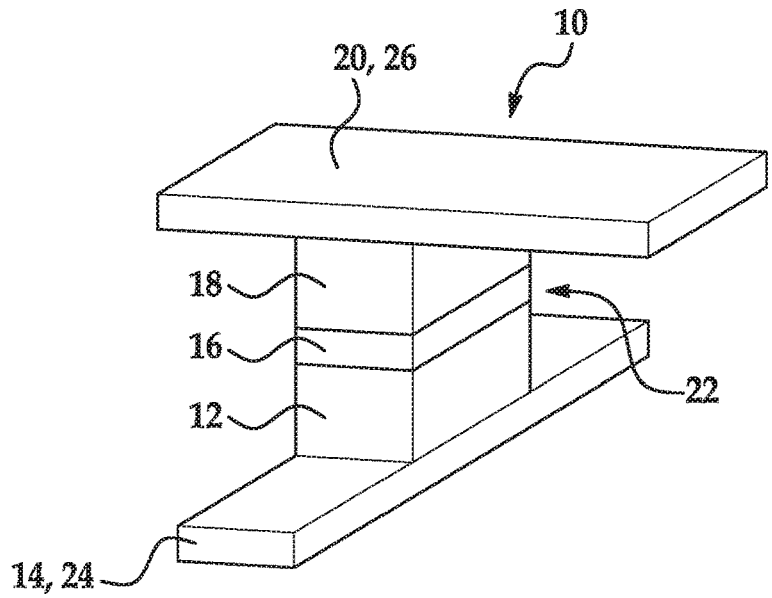
FIG. 2 is a semi-schematic, perspective view of an example of a resistive memory device disclosed herein.

The method 100 will be discussed in reference to FIGS. 1, 2 and 3. FIGS. 2 and 3 illustrate two examples of the resistive memory device 10, 10' that may be formed using the method 100.

At reference numeral 102 in FIG. 1, and in both FIGS. 2 and 3, the selector 12 is formed on a first electrode 14. The first electrode 14 may be provided or fabricated using any suitable technique, such as lithography (e.g., photolithography, electron beam lithography, imprint lithography, etc.), thermal or e-beam evaporation, sputtering, atomic layer deposition (ALD), or the like. Example materials for the first electrode 14 include Pt, Ta, Hf, Zr, Al, Co, Ni, Fe, Nb, Mo, W, Cu, Ti, TiN, TaN, Ta$_2$N, WN$_2$, NbN, MoN, TiSi$_2$, TiSi, Ti$_5$Si$_3$, TaSi$_2$, WSi$_2$, NbSi$_2$, V$_3$Si, electrically doped polycrystalline Si, electrically doped polycrystalline Ge, and combinations thereof. Although the electrode 14 is shown with a rectangular cross-section, it is to be understood that the electrode 14 may also have a trapezoidal, a circular, an elliptical, or another more complex cross-section. The electrode 14 may also have many different widths or diameters and aspect ratios or eccentricities. As shown in FIG. 2, the electrode 14 may be the bottom electrode/conductor 24 which functions as one of the lines of a crossbar array. As shown in FIG. 3, the electrode 14 may be used to electrically connect the selector 12 to another bottom electrode/conductor 24 which functions as one of the lines of the crossbar array.

The selector 12 may be formed directly on the electrode 14. Techniques for forming the selector 12 will be discussed further hereinbelow.

The selector 12 disclosed herein is made of the cation doped composite dielectric material (also referred to herein as the composite dielectric material). The doped composite dielectric material includes a mixture of a first dielectric material and a second dielectric material that is different from the first dielectric material (referred to as the other or the denser dielectric material), and a dopant material that includes a cation having a migration rate that is faster than the migration rate of oxygen or nitrogen element(s) present in the memristor 18. In some instances, the selector 14 consists of these materials (i.e., no other materials are included).

The first dielectric material may be a dielectric material having a suitable dielectric constant (relative permeability), dielectric strength, and dielectric loss (dissipation factor). A lower dielectric constant, a higher dielectric strength, and a lower dielectric loss may be suitable for the first dielectric material. As examples, the dielectric constant may be less than 10, the dielectric strength may be about $1*10^7$ V/cm (1 V/nm), and the dielectric loss may range from about 0.1% to about 1%. Examples of the first dielectric material include SiO$_2$ (dielectric constant of 4) and SiN$_x$ (e.g., Si$_3$N$_4$ having a dielectric constant of 7, or some variation from stoichiometry).

Any dielectric material that is different from the selected first dielectric material may be used as the second or other dielectric material in the composite dielectric material. In an example, the second dielectric material has similar properties as the first dielectric material. In an example, the second dielectric material is selected to be denser than the first dielectric material. Examples of the second dielectric material include Al$_2$O$_3$ (dielectric constant of 9), Ta$_2$O$_5$ and MgO.

As previously mentioned, the dopant material in the composite dielectric material is an oxide that includes a cation having a migration rate that is faster than the migration rate of the oxygen or the nitrogen element(s) of the memristor 18. Examples of the cation in the oxide dopant material include Ag, Cu, Ni, Li, and Na. As such, an example of the dopant material includes AgO$_x$ (where x=0.5 at stoichiometry). It is to be understood that AgO$_x$ or other example dopants may vary from stoichiometry.

The composition of the composite dielectric material may be altered in order to tune the threshold/switching voltage of the selector 12 to correspond with the threshold/switching voltage of the memristor 18 that is to be used in the device 10, 10'. In an example of the composite dielectric material, the ratio of the first dielectric material to the second dielectric material ranges from 1:9 to 9:1, and a concentration of the dopant material in the composite dielectric material ranges from about 1% up to 50%. An example composite dielectric material includes SiO$_2$ as the first dielectric material, Al$_2$O$_3$ as the second dielectric material, and AgO$_x$ as the dopant material. In this example, the SiO$_2$ and Al$_2$O$_3$ may be present in a 1:1 ratio, and the concentration of AgO$_x$ may be about 25%. This example composite dielectric material has a threshold voltage ranging from about 1V to about 2 V and a switching speed greater than 10 μs.

The selector 12 may be formed by co-sputtering or co-evaporating all three of the materials to be included in the composite dielectric material on the electrode 14. As examples, the selector 12 may be formed through a DC pulsed or RF co-sputtering from a physical vapor deposition (PVD) system. In one example of sputtering, targets of each of the first dielectric material and the second dielectric material are used. In this example, the composite dielectric is deposited through the combination of the two targets with Ar/O$_2$ plasma. The ratio may be controlled by the location of each target and/or by the power allocation to each target (which will impact the deposition speed of each target). In this example, the dopant material target is also present. In another example of sputtering, a compound target having the fixed composition of the first dielectric material, the second dielectric material, and the dopant material may be used.

In an example of evaporation, source materials for the first dielectric material, the second dielectric material, and the dopant material are evaporated in a vacuum.

The sputtering or evaporation parameters are controlled to form the composite dielectric material with the selected composition. For example, the dielectric mixture and dopant levels may be controlled by adjusting the sputtering rates of each material to match a target ratio and dopant concentration. Depending on the adjustments available in a given sputtering system, sputtering rates can be affected by modifying substrate table height, gas mixture, and power allotment to each target. Using ON/OFF intervals for the dopant material allows lower doping levels once sputter rate adjustments have been exhausted. As example parameters, the substrate table height may range from about 30 mm to about 65 mm, the O$_2$ flow may range from about 5% to about 47%, and the power may vary depending upon the materials used. For example, the power for sputtering SiO$_2$ may range from about 180 W to about 450 W, the power for sputtering Al$_2$O$_3$ may range from about 365 W to about 475 W, and the power for sputtering Ag may range from about 25 W to about 50 W. The table below illustrates a few more specific examples.

TABLE

| Composite Dielectric Material | Parameters |
| --- | --- |
| 5% AgO$_x$ and 95% 1:1 SiO$_2$:Al$_2$O$_3$ | Co-sputter SiO$_2$ at 200 W, Al$_2$O$_3$ at 365 W and Ag at 50 W for 2 seconds ON every 30 seconds |
| 8% AgO$_x$ and 92% 1:1 SiO$_2$:Al$_2$O$_3$ | Co-sputter SiO$_2$ at 200 W, Al$_2$O$_3$ at 365 W and Ag at 50 W for 3 seconds ON every 29 seconds |

The selector 12 may also be formed by sequentially depositing the first dielectric material, the second dielectric material, and the dopant material. This type of deposition may take place in cycles, and during each cycle, monolayers of the first dielectric material, the second dielectric material, and the dopant material are deposited.

The selector 12 may be formed to have a suitable thickness. In an example, the thickness ranges from about 2 nm to about 100 nm. In another example, the thickness is about 15 nm. It is to be understood that the sputtering or evaporation parameters (e.g., deposition time, etc.) may be controlled to achieve a suitable thickness for the selector 12.

At reference numeral 104 in the method 100 shown in FIG. 1, the selector 12 is coupled with another electrode 16 (e.g., a second electrode or middle electrode). The electrode 16 may be formed of any of the materials set forth herein for the electrode 14. The electrode 16 may be a pre-formed electrode that is positioned on the selector 12, or the material that is to form the electrode 16 may be deposited on the selector 12.

In the final devices 10, 10', the electrode 16 is positioned between the selector 12 and the memristor 18, and thus electrically couples the two components 12, 18.

At reference numeral 106 in the method 100 shown in FIG. 1, the memristor 18 is coupled with the electrode 16. The memristor 18 is made of a switching material whose resistance changes with an applied voltage across or through the memristor 18. As briefly discussed herein, the memristor 18 may "memorize" its last resistance, at least until an opposite voltage is applied.

In the examples disclosed herein, the memristor 18 may be based on a variety of materials including oxygen element (s) and/or nitrogen element(s). As used herein, the oxygen elements may be oxygen ions and/or vacancies and/or the nitrogen elements may be nitrogen ions and/or vacancies. The migration of the ions is via a vacancy mechanism. As examples, the memristor 18 may include an oxygen or nitrogen deficient portion that creates oxygen or nitrogen vacancies. When oxygen or nitrogen ions are removed from portion(s) of memristor 18 while it maintains the crystalline lattice intact, the spaces the oxygen ions or nitrogen ions formerly occupied are called oxygen vacancies or nitrogen vacancies, respectively. These vacancies may be formed, and may form a conductive channel, when the threshold voltage of the memristor 18 is applied. As an example, the migration of oxygen ions may be within nanoseconds.

The memristor 18 may be oxide-based, meaning that at least a portion of the memristor 18 is formed from an oxide-containing material. The memristor 18 may also be nitride-based, meaning that at least a portion of the memristor 18 is formed from a nitride-containing composition. Furthermore, the memristor 18 may be oxy-nitride based, meaning that a portion of the memristor 18 is formed from an oxide-containing material and that a portion of the memristor 18 is formed from a nitride-containing material. In some examples, the memristor 18 may be formed based on tantalum oxide ($TaO_x$) or hafnium oxide ($HfO_x$) compositions. Other example materials for the memristor 18 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride.

In addition, it is to be understood that other functioning memristors may be employed in the examples disclosed herein, as long as they include oxygen and/or nitrogen. For example, the memristor portion 18 of the device 10, 10' may have multiple layers that include additional electrodes/conductors.

Referring now specifically to FIG. 2, the selector 12, electrode 16, and memristor 18 are to be positioned within a junction 22 between two crossing electrodes 14, 24 and 20, 26. As shown in FIG. 2, the electrode 20 may be the top electrode/conductor 26, which functions as one of the lines of a crossbar array.

Prior to coupling the top electrode 20, 26 (as shown in FIG. 2), the stack of materials 12, 16, and 18 to be positioned at the junction 22 may be patterned to the size of the junction 22. In the example shown in FIG. 2, it is to be understood that after initial formation, the stack of materials 12, 16, and 18 may extend across electrode 14, 24, and thus may extend beyond the junction 22 to be formed between addressing electrodes 14, 24 and 20, 26. This may occur, for example, when the stack of materials 12, 16, and 18 are blanket deposited. In these instances, the entire stack of materials 12, 16, and 18 may be patterned to the shape of the junction 22. Patterning may be accomplished using masking (e.g., using a Cr etch mask) and etching, or some other suitable selective removal technique. A single etchant or multiple etchants may be used that is/are capable of removing portions of each layer of the stack that is present outside of the junction 22.

In an example, after the stack 12, 16, and 18 is etched and positioned at the junction, junction (i.e., bit) isolation may be accomplished. Junction isolation may be accomplished by depositing an insulating dielectric material on exposed surfaces of the electrode 14, 24 (or on the surface of an underlying substrate (not shown) so that the insulating dielectric material(s) partially or completely surround the stack 12, 16, and 18.

Suitable deposition techniques for the insulating dielectric material(s) include physical and chemical techniques, including evaporation from a heated source, such as a filament or a Knudsen cell, electron beam (i.e., e-beam) evaporation from a crucible, sputtering from a target, other forms of evaporation, chemical vapor deposition (CVD), physical vapor deposition (PVD), molecular beam deposition, atomic layer deposition (ALD), pulse laser deposition, or various other forms of chemical vapor or beam growth from reactive precursors. Appropriate deposition or growth conditions, such as speed and temperature, may be selected to achieve the desirable chemical composition and local atomic structure desired for the insulating dielectric material (s).

Examples of suitable materials for the insulating dielectric material include silicon dioxide ($SiO_2$), silicon nitride ($Si_3N_4$), spin-on-glass, or aluminum oxide ($Al_2O_3$).

To form the device 10 in FIG. 2, the memristor 18 is coupled with the other electrode 20 (e.g., a third electrode). This step is shown at reference numeral 108 in the method 100 of FIG. 1. The electrode 20 may be formed of any of the materials set forth herein for the electrode 14. In this example, the electrode 20 is the top electrode/conductor 26, which functions as one of the lines of a crossbar array. The electrode 20, 26 may be a pre-formed electrode that is positioned on the memristor 18 at some non-zero angle with respect to the electrode 14, 24. The non-zero angle positioning prevents shorting of the resulting device(s)/cell(s) 10, for example, when multiple devices/cells 10 are formed on a single electrode 14, 24 in the crossbar array configuration.

In the device 10' shown in FIG. 3, the memristor 18 is also coupled with the other electrode 20' (e.g., the third electrode). The electrode 20' may be formed of any of the materials set forth herein for the electrode 14. In this example, the electrode 20' may be a pre-formed electrode that is positioned on the memristor 18, or the material that is to form the electrode 20' may be deposited on the memristor 18. However, in this example device 10', the electrode 20' is not the top electrode/conductor 26. Rather, in this example device 10', a separate top electrode/conductor 26' is included which can function as one of the lines of a crossbar array.

As such, in the device 10', the electrode 14, the selector 12, the electrode 16, the memristor 18, and the electrode 20' are to be positioned within the junction 22 between two crossing electrodes 24 and 26'. However, prior to coupling the top electrode 26' with the electrode 20', the stack of materials 14, 12, 16, 18, and 20' to be positioned at the junction 22 may be patterned to the size of the junction 22. In the example shown in FIG. 3, it is to be understood that after initial formation, the stack of materials 14, 12, 16, 18, and 20' may extend across electrode 24, and thus may extend beyond the junction 22 to be formed between addressing electrodes 24 and 26'. In these instances, the entire stack of materials 14, 12, 16, 18, and 20' may be patterned to the shape of the junction 22.

Patterning may be accomplished using masking and etching, or some other suitable selective removal technique. A single etchant or multiple etchants may be used that is/are capable of removing portions of each layer of the stack that is present outside of the junction 22. In this example, an insulating dielectric material may also be deposited to at least partially surround the stack of materials 14, 12, 16, 18, and 20' positioned at the junction 22.

For the device 10', the electrode 20' is coupled with the top electrode 26'. The electrode 26' may be formed of any of the materials set forth herein for the electrode 14. The electrode 26' may be a pre-formed electrode that is positioned on the electrode 20' at some non-zero angle with respect to the bottom electrode 24. The non-zero angle positioning prevents shorting of the resulting device(s)/cell (s) 10', for example, when multiple devices/cells 10' are formed on a single electrode 24 in the crossbar array configuration.

In yet another example, the device 10' may also be formed without electrode 14 or electrode 20'.

In addition, it is to be understood that each of the electrodes (i.e., 14; 14, 24; 16; 20, 26; 20', and 26') may be a single layer or multiple layers of conductive materials, and may be symmetric or asymmetric. As an example, a bottom electrode 14, 24 may be TiN and a top electrode 20, 26 may include one layer of TiN and another layer of a different electrode material.

The devices 10, 10' may be incorporated into a resistive memory array. An example resistive memory array 30 including a plurality of the devices 10' is shown in FIG. 4. In the example shown in FIG. 4, the array 30 includes four of the resistive memory devices 10', namely $10'_{R1C2}$, $10'_{R2C2}$, $10'_{R1C1}$, and $10'_{R2C1}$. Generally, the array 30 is an array of switches (i.e., devices, cells, etc.) with two outer sets of conductors/electrodes forming respective rows R1, R2 and columns C1, C2 that are used to target/select the different resistive memory devices $10'_{R1C2}$, $10'_{R2C2}$, $10'_{R1C1}$, and $10'_{R2C1}$. The electrodes 24, 24' in the set of parallel bottom conductors/electrodes cross the electrodes 26', 26" in the set of parallel top conductors/electrodes at non-zero angles. In many instances, the two outer sets of conductors 24, 24' and 26', 26" are perpendicular to each other. However, the two outer sets of conductors 24, 24' and 26', 26" may be offset at any non-zero angle.

In the resistive memory array 30, a respective resistive memory device $10_{R1C2}$, $10_{R2C2}$, $10_{R1C1}$, $10_{R2C1}$ is formed at each pair of crossing conductors 24, 26' or 24', 26', or 24, 26", or 24', 26". A junction $22_{R1C2}$, $22_{R2C2}$, $22_{R1C1}$, $22_{R2C1}$ is located at respective cross-points of each pair of crossing conductors 24, 26" or 24', 26", or 24, 26', or 24', 26'. A resistive stack is formed/positioned in each junction $22_{R1C2}$, $22_{R2C2}$, $22_{R1C1}$, $22_{R2C1}$. Each resistive stack 18 includes the selector 12 and the memristor 18, with the electrode 16 positioned therebetween. It is to be understood that in the devices 10, 10' and the array(s) 30 disclosed herein, the configuration of the materials 12 and 18 within the resistive stack may be switched, such that the memristor 18 is positioned near the bottom electrode 14, 24 or 24 and the selector 12 is positioned near the top electrode 20, 26 or 26'.

For the array 30, it is to be understood that the selector 12 and memristor 18 at each junction $22_{R1C2}$, $22_{R2C2}$, $22_{R1C1}$, $22_{R2C1}$ are both addressable after initial fabrication by virtue of the respective outer electrodes 24, 26" or 24', 26", or 24, 26', or 24', 26' in electrical contact with the selector 12 and memristor 18. For example, if the electrode 24 in row R1 and the electrode 26" in column C2 are addressed with an appropriate polarity and voltage (which is at or beyond the corresponding threshold voltages of the selector 12 and memristor 18), the device $10_{R1C2}$ is activated so that the selector 12 is in the ON state and the memristor 18 portion is switched to either the ON state or the OFF state. For another example, if the electrode 24' in row R2 and the electrode 26' in column C1 are addressed with an appropriate polarity and voltage (which is at or beyond the corresponding threshold voltages of the selector 12 and memristor 18), the device $10_{R2C1}$ is activated so that the selector 12 is in the ON state and the memristor 18 portion is switched to either the ON state or the OFF state. In the array 30, it is to be understood that when one or more individual devices $10_{R1C2}$, $10_{R2C2}$, $10_{R1C1}$, $10_{R2C1}$ is/are addressed/targeted, the selector 12 disclosed herein advantageously aids in isolating the selected memristor 18, and improving the nonlinearity and speed of the desired operation.

To further illustrate the present disclosure, an example is given herein. It is to be understood that this example is provided for illustrative purposes and is not to be construed as limiting the scope of the present disclosure.

Example

An example selector and a comparative example selector were prepared.

The example selector included the composite dielectric material disclosed herein sandwiched between two TiN electrodes. The composite dielectric material included a mixed oxide of $SiO_2$ and $Al_2O_3$ in a 1:1 ratio doped with a concentration of $AgO_x$ of about 25%. The example selector was deposited, using co-sputtering, through the combination of an $SiO_2$ target and an $Al_2O_3$ target with $Ar/O_2$ plasma. During co-sputtering from the $SiO_2$ and $Al_2O_3$ targets, an Ag metal target was present. This target was turned on and off to a set power at a set interval to achieve the doping level.

The comparative example selector included a comparative dielectric material sandwiched between a TiN electrode and a layered TiN and Cr electrode. The comparative dielectric material included $SiO_2$ doped with a concentration of $AgO_x$ of about 25%. The comparative selector was deposited by sputtering from an $SiO_2$ target with $Ar/O_2$ plasma. During sputtering from the $SiO_2$ target, an Ag metal target was present. This target was turned on and off to a set power at a set interval to achieve the doping level.

Figure 5:
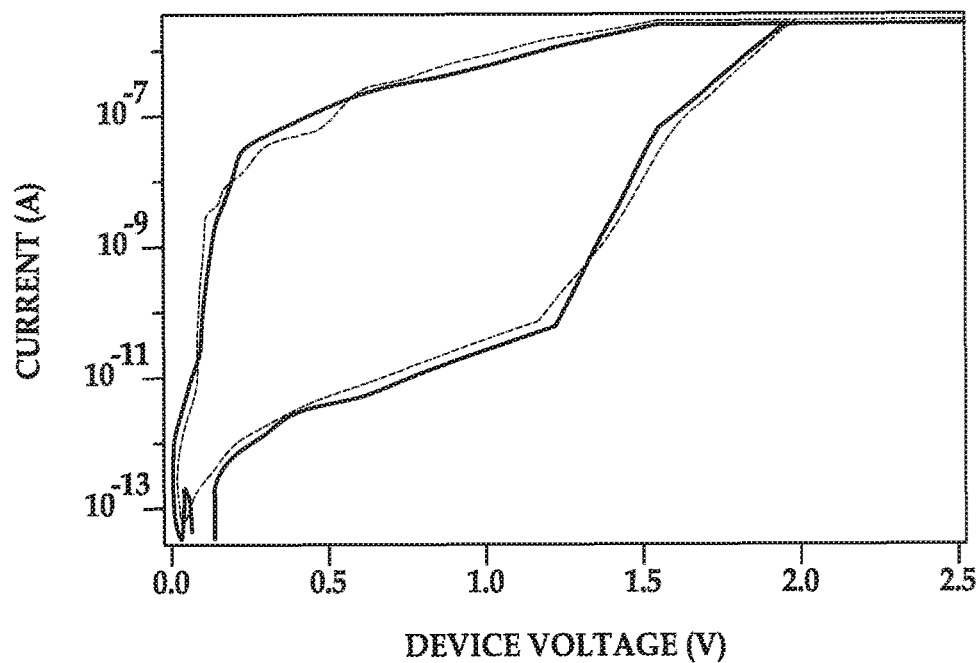
FIG. 5 is a graph illustrating two consecutive I-V loops for an example of a selector disclosed herein.
Figure 6:
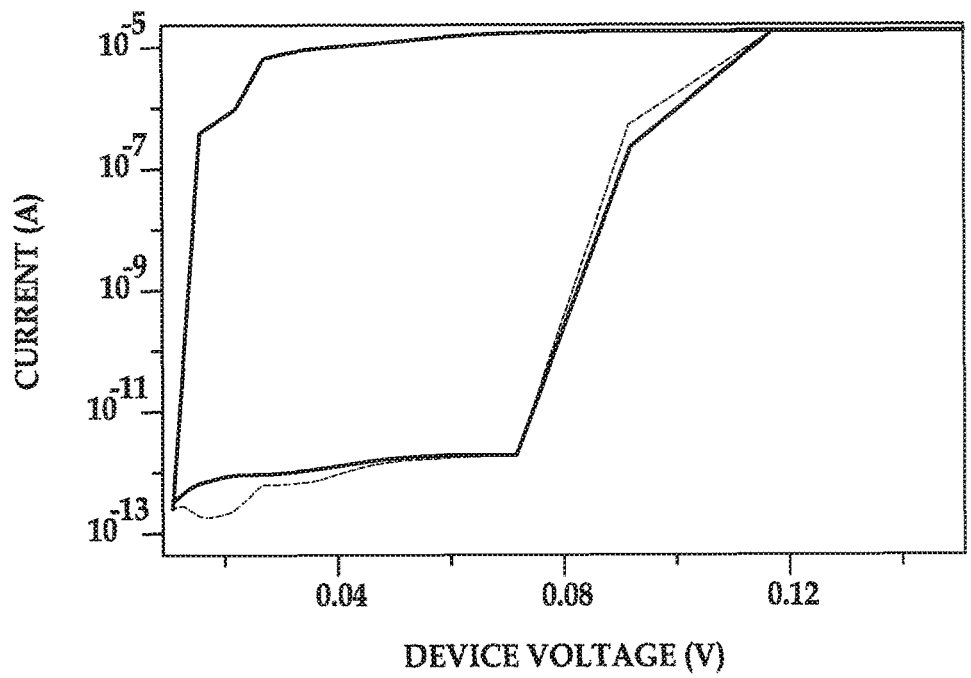
FIG. 6 is a graph illustrating two consecutive I-V loops for a comparative example of a selector.

Current-voltage loops were obtained for each of the example selector and comparative example selector. The results for the example selector are shown in FIG. 5 and the results for the comparative example selector are shown in FIG. 6. As shown in FIG. 6, the comparative example selector exhibited volatile threshold switching with relatively large nonlinearity, but the threshold voltage was extremely low (<0.1V). In contrast, as shown in FIG. 5, the example selector exhibited volatile threshold switching with relatively large nonlinearity, and the threshold voltage was more suitable (>1V) for being coupled with a memristor.

It is to be understood that the components of the examples disclosed herein may be positioned in a number of different orientations, and any directional terminology used in relation to the orientation of the components is used for purposes of illustration and is in no way limiting, unless specified otherwise. Directional terminology includes words such as "top," "bottom," "horizontal," "vertical," etc. As an example, any of the devices may be oriented with the electrodes 20, 20' as the bottom conductor, and the electrodes 14, 14' as the top conductors.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range of from about 1% up to 50% should be interpreted to include not only the explicitly recited limits of from about 1% up to 50%, but also to include individual values, such as 2.5%, 32%, 45.75%, etc., and sub-ranges, such as from about 10% to about 40%, from about 15% to about 47%, etc.

Furthermore, when "about" or "substantially" is utilized to describe a value, this is meant to encompass minor variations (up to +/−10%) from the stated value.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

What is claimed is:

1. A resistive memory device, comprising:
a first electrode;
a memristor coupled in electrical series with the first electrode, the memristor including oxygen or nitrogen elements;
a second electrode coupled in electrical series with the memristor;
a selector coupled in electrical series with the second electrode, the selector including a composite dielectric material of:
a first dielectric material and a second dielectric material that is different from the first dielectric material present in a ratio ranging from 1:9 to 9:1; and
a dopant material including a cation having a migration rate faster than the oxygen or the nitrogen elements of the memristor, wherein a concentration of the dopant material in the composite dielectric material ranges from about 1% up to 50%; and
a third electrode coupled in electrical series with the selector.

2. The resistive memory device as defined in claim 1 wherein the ratio of the first dielectric material to the second dielectric material and the concentration of the dopant material render the selector with a switching voltage that corresponds with a switching voltage of the memristor.

3. The resistive memory device as defined in claim 1 wherein the first dielectric material is selected from the group consisting of $SiO_2$ and $SiN_x$.

4. The resistive memory device as defined in claim 1 wherein the second dielectric material is selected from the group consisting of $Al_2O_3$, $Ta_2O_5$ and $MgO$.

5. The resistive memory device as defined in claim 1 wherein the dopant material is an oxide of the cation selected from the group consisting of Ag, Cu, Ni, Li, and Na.

6. The resistive memory device as defined in claim 1 wherein the first dielectric material is $SiO_2$, the second material is $Al_2O_3$, and the dopant material is $AgO_x$.

7. The resistive memory device as defined in claim 6 wherein the ratio of the first dielectric material to the second dielectric material is 1:1 and wherein the concentration of the dopant material is about 25%.

8. The resistive memory device as defined in claim 1 wherein the memristor has one of:
an oxide composition based on tantalum oxide, hafnium oxide, titanium oxide, yttrium oxide, niobium oxide, zirconium oxide, aluminum oxide, calcium oxide, magnesium oxide, dysprosium oxide, lanthanum oxide, or silicon dioxide; or
a nitrogen composition based on aluminum nitride, gallium nitride, tantalum nitride, or silicon nitride.

9. A resistive memory array, comprising:
a bottom electrode;
a first top electrode crossing the bottom electrode at a non-zero angle;
a second top electrode electrically isolated from the first top electrode and crossing the bottom electrode at an other non-zero angle;
a first junction formed at a first cross-point of the bottom electrode and the first top electrode;
a second junction formed at a second cross-point of the bottom electrode and the second top electrode;
a resistive stack positioned at each of the first and second junctions, the resistive stack including:
a memristor including oxygen or nitrogen elements; and
a selector in electrical series with the memristor, the selector including a composite dielectric material of:
a first dielectric material and a second dielectric material that different from the first dielectric material present in a ratio ranging from 1:9 to 9:1; and
a dopant material including a cation having a diffusion rate faster than the oxygen or the nitrogen of the memristor, wherein a concentration of the dopant material in the composite dielectric material ranges from about 1% up to 50%; and
respective first and second middle electrodes positioned between the memristor and the selector at each of the first and second junctions.

10. The resistive memory array as defined in claim 9 wherein the ratio of the first dielectric material to the second dielectric material and the concentration of the dopant material render the selector with a switching voltage that corresponds with a switching voltage of the memristor.

11. The resistive memory array as defined in claim 10 wherein:
the first dielectric material is $SiO_2$;
the second dielectric material is $Al_2O_3$;
the ratio of $SiO_2$ to $Al_2O_3$ is 1:1;
the dopant material is $AgO_x$;
the concentration of the $AgO_x$ is 25%; and the switching voltage of the selector ranges from 1V to 2 V.

12. The resistive memory array as defined in claim 9 wherein:
the first dielectric material is selected from the group consisting of $SiO_2$ and $SiN_x$;
the second dielectric material is selected from the group consisting of $Al_2O_3$, $Ta_2O_5$ and MgO; and
the dopant material is an oxide of the cation selected from the group consisting of Ag, Cu, Ni, Li, and Na.

* * * * *